United States Patent
Duscher

(10) Patent No.: US 7,339,414 B2
(45) Date of Patent: Mar. 4, 2008

(54) METHOD AND CIRCUIT ARRANGEMENT FOR MONITORING THE MODE OF OPERATION OF ONE OR MORE LOAD CIRCUITS, ESPECIALLY OF A DOMESTIC APPLIANCE

(75) Inventor: Christian Duscher, Undorf (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 27 days.

(21) Appl. No.: 10/567,628

(22) PCT Filed: Jul. 14, 2004

(86) PCT No.: PCT/EP2004/007789

§ 371 (c)(1),
(2), (4) Date: Mar. 21, 2006

(87) PCT Pub. No.: WO2005/017541

PCT Pub. Date: Feb. 24, 2005

(65) Prior Publication Data

US 2006/0181261 A1    Aug. 17, 2006

(30) Foreign Application Priority Data

Aug. 8, 2003 (DE) ................ 103 36 604

(51) Int. Cl.
*H03K 17/13* (2006.01)
(52) U.S. Cl. ............ 327/452; 327/456; 318/430; 318/474

(58) Field of Classification Search ......... 327/447, 327/448, 452, 456; 318/430, 474
See application file for complete search history.

(56) References Cited

U.S. PATENT DOCUMENTS

| 4,109,308 | A |   | 8/1978 | Rödel |
|---|---|---|---|---|
| 4,464,661 | A |   | 8/1984 | Redmond |
| 5,300,917 | A |   | 4/1994 | Maue et al. ............ 338/49 |
| 5,539,320 | A |   | 7/1996 | Vetter et al. ........... 324/601 |
| 5,945,802 | A | * | 8/1999 | Konrad et al. ......... 318/807 |
| 6,593,767 | B1 | * | 7/2003 | Tanaka et al. ......... 324/772 |

FOREIGN PATENT DOCUMENTS

| DE | 2 150 888 | | 4/1973 |
|---|---|---|---|
| DE | 37 40 482 | A1 | 6/1989 |
| DE | 42 27 827 | A1 | 2/1994 |
| DE | 43 41 425 | A1 | 6/1995 |
| SU | 840 747 | | 6/1981 |

* cited by examiner

*Primary Examiner*—Kenneth B. Wells
(74) *Attorney, Agent, or Firm*—Laurence A. Greenberg; Werner H. Stemer; Ralph E. Locher

(57) ABSTRACT

The invention relates to a method and a circuit arrangement for monitoring the mode of operation of one or more load circuits, especially of a domestic appliance, which contains a controlled semiconductor switch, such as a triac, and an electric consumer. Said switches are supplied by at least one alternating voltage source that supplies an alternating voltage including positive and negative voltage half-waves. The invention is characterized in that the currents flowing through all controlled semiconductor switches (T1, T2) and the electric consumers (R1, R2) are guided through a common low-impedance precision resistor (Rm). The respective voltage drop occurring over the low-impedance precision resistor (Rm) is separately evaluated with respect to the amplitudes of the positive and negative voltage half-waves.

10 Claims, 1 Drawing Sheet

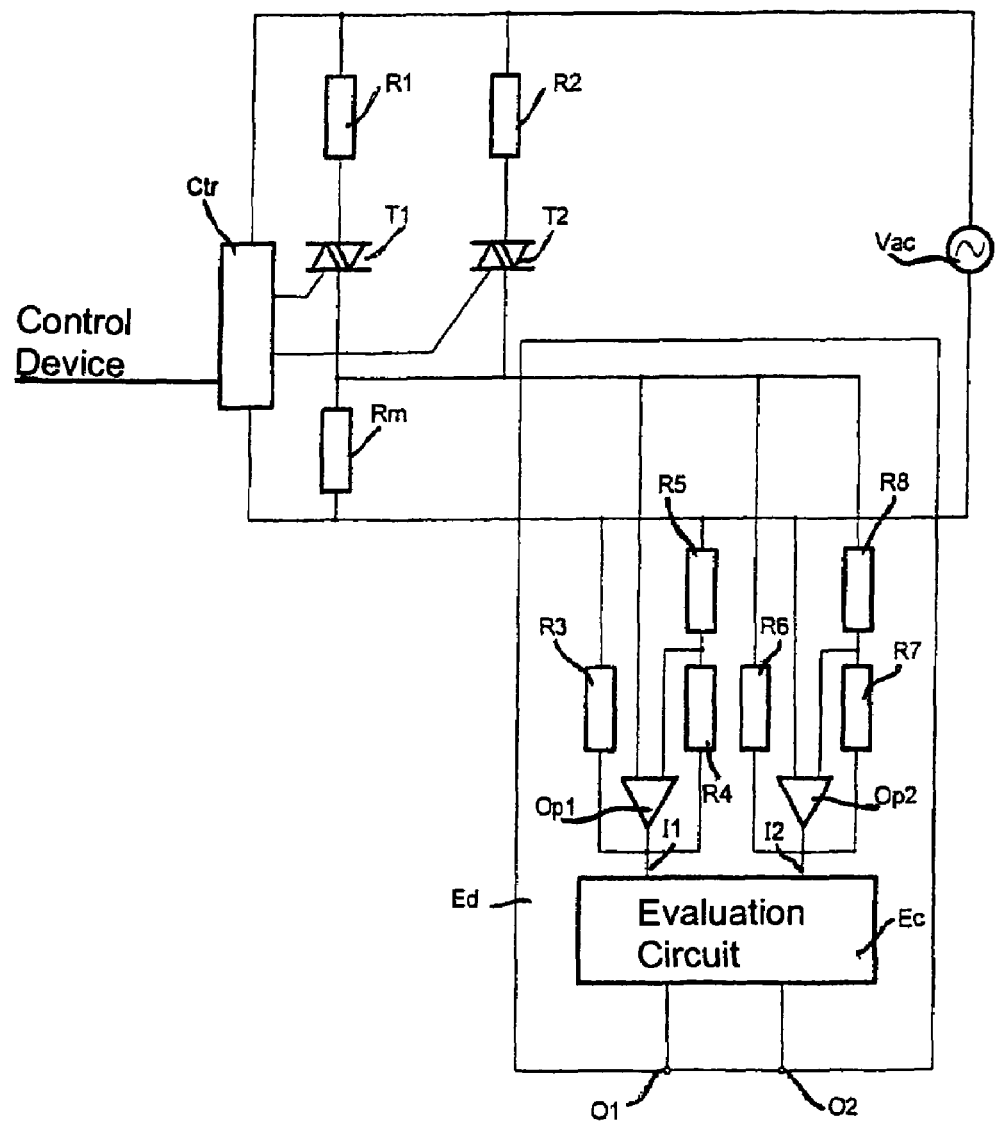

METHOD AND CIRCUIT ARRANGEMENT FOR MONITORING THE MODE OF OPERATION OF ONE OR MORE LOAD CIRCUITS, ESPECIALLY OF A DOMESTIC APPLIANCE

BACKGROUND OF THE INVENTION

Field of the Invention

The invention relates to a method and a circuit arrangement for monitoring the mode of operation of one or more load circuits, especially of a domestic appliance, which comprises a controlled semiconductor switch, especially a triac, and an electric consumer connected thereto, which are supplied by at least one alternating voltage source, that supplies an alternating voltage including positive and negative voltage half-waves.

For monitoring the mode of operation of a load circuit containing a dc motor it is already known (see for example, Siemens switching examples, 1982/83 edition, page 37, FIG. 2.2 and page 47, FIG. 2.5) to pass the current flowing in the load circuit via a low-impedance precision resistor (shunt resistor) and evaluate the voltage drop at this precision resistor by means of an operational amplifier. Monitoring the mode of operation of one or more load circuits supplied by at least one alternating voltage source, that is not supplied by a dc voltage, is not known in this connection.

SUMMARY OF THE INVENTION

It is thus the object of the invention to show a way of monitoring the mode of operation of one or more load circuits supplied by at least one alternating voltage source, in a relatively simple manner.

The object indicated previously is solved according to the invention in a method of the type specified initially by guiding the currents flowing through all controlled semiconductor switches and electric consumers through a common low-impedance precision resistor and separately evaluating the respective voltage drop occurring at this low-impedance precision resistor with regard to the amplitudes of the positive and negative voltage half-waves.

The present invention uses a low-impedance precision resistor as in the prior art considered above but in this case, only a single low-voltage precision resistor is provided for all the existing load circuits. In addition, in the present invention the respective positive and negative voltage drops occurring separately at the single low-voltage precision resistor used, which are attributable to the current flows through all the monitored load circuits, are evaluated separately. As a result, if one or more of the load circuits is working incorrectly, conclusions on various faults in the load circuits concerned can be drawn according to whether, and optionally which, of the positive and/or negative voltage drops at said single low-voltage precision resistor are equal to predefined rated values. For example, from a rise in the positive and the negative voltage drops at said single precision resistor above predefined rated values in the case of an electric motor representing an electrical consumer, such as a pump motor of a domestic appliance, it can be deduced that this motor is not running correctly. In the case of a positive or negative voltage drop at said single low-impedance precision resistor which deviates from a predefined rated value, a faulty operating mode of one or more controlled semiconductor switches can be recognized for example. This leads to a limitation of possible faulty parts of the monitored load circuits.

Preferably used for carrying out the method according to the invention is a circuit arrangement which is characterized in that all the electric consumers together with their relevant controlled semiconductor switches are connected via a low-impedance precision resistor to the at least one alternating voltage source and that an evaluation arrangement which evaluates the positive and the negative voltage half-waves of said alternating voltage is connected to said low-impedance precision resistor. This yields the advantage of a particularly low expenditure on circuitry to monitor the mode of operation of one or more load circuits according to the invention.

More appropriately, the evaluating arrangement comprises a first evaluating device which evaluates the positive voltage half-waves of the relevant alternating voltage and a second evaluating device which evaluates the negative voltage half-waves of the relevant alternating voltage. The advantage of an evaluating device having a particularly simple structure is hereby obtained.

A particularly low expenditure on circuitry is advantageously obtained if each of the two evaluating devices is formed by an operational amplifier which has its inverting input and its non-inverting input connected to the two ends of said low-impedance precision resistor.

More appropriately in this case, a first operational amplifier has its non-inverting input and a second operational amplifier has its inverting input connected to one end of said precision resistor and said first operational amplifier has its inverting input and said second operational amplifier has its non-inverting input connected to the other end of said precision resistor. As a result of this circuitry measure, the two said operational amplifiers can evaluate different-priority voltage half-waves of the respective decreasing alternating voltage at said precision resistor.

According to another appropriate embodiment of the present invention, connected to the outputs of the two operational amplifiers is an evaluating circuit which compares the output signals respectively delivered by the two operational amplifiers with specified threshold voltages and which, depending on the magnitudes by which the output voltages respectively delivered by the relevant operational amplifiers exceed or fall below said specified threshold voltages, delivers status signals which either indicate a correct current flow or a perturbed current flow through the respective electric consumers and the controlled semiconductor switches associated therewith. This yields the advantage of a particularly low expenditure on circuitry for the construction of said evaluating circuit; in principle, this evaluating circuit can manage with two voltage comparators.

The method and the circuit arrangement according to the invention are explained in detail with reference to a drawing.

BRIEF DESCRIPTION OF THE DRAWINGS

The single FIGURE of the drawing is a block circuit diagram of a circuit for monitoring an operation of at least one load circuit according to the invention.

DESCRIPTION OF THE PREFERRED EMBODIMENT

The drawing shows an exemplary embodiment of a circuit arrangement according to the present invention. The relevant circuit arrangement is used in the present case for monitoring the operating mode of two load circuits which especially can be provided in a domestic appliance such as a washing machine, a dishwasher, a drier etc. Of the two load circuits shown, one comprises an electric consumer R1 and the other comprises an electric consumer R2. These electric consumers R1, R2 can, for example, be electric motors or heating resistors. The two electric consumers shown R1 and R2 are each connected in series with a controlled semiconductor switch T1 or T2 and specifically with the load section of the respective semiconductor switch T1 or T2. In the present case, the relevant controlled semiconductor switches are formed by triacs whose control electrodes are connected to control outputs of a control circuit Ctr, not described in detail, which are supplied by an alternating voltage source Vac indicated in the drawing. Instead of the aforementioned triacs, however, other controlled semiconductor switches can also be used such as thyristors, power transistors such as so-called power MOS-FETS etc.

All the controlled semiconductor switches T1, T2 provided and the electric consumers R1 or R2 connected thereto are jointly connected via a low-impedance precision resistor Rm to an alternating voltage source Vac which supplies an alternating voltage comprising positive and negative voltage half-waves and which, for example, can be the usual mains alternating voltage of 230 V, 50 Hz.

However, it is possible in principle to provide each of the consumer circuits provided with its own alternating voltage source.

An evaluating arrangement Ed which separately evaluates the positive and the negative half-waves of the decreasing alternating voltage at this precision resistor is connected to the low-impedance precision resistor Rm whose resistance depends on the magnitude of the maximum predicted flowing currents and which can have a value of 0.1 Ohm for example. This evaluating arrangement Ed comprises two evaluating devices in the form of respectively one operational amplifier Op1, Op2.

The operational amplifier Op1 to be designated as first operational amplifier has its non-inverting input (+) connected to the common connection point of the triac T1, T2 and the low-impedance precision resistor Rm and has its inverting input (−) connected via a resistor R5 to the other end of the precision resistor Rm. The output of the first operational amplifier Op1 is further connected via the resistor R3 to this other end of the precision resistor Rm which can optionally be earthed or be at earth potential. The relevant output of the first operational amplifier Op1 is also connected via a resistor R4 to its inverting input (−).

The operational amplifier Op2 to be designated as the second operational amplifier, which furthermore can be or is of the same type of operational amplifier as the first operational amplifier Op1, has its inverting input (−) connected via a resistor R8 to the common connection point of the triac T1, T2 and the low-impedance precision resistor Rm. The non-inverting input (+) of the second operational amplifier Op2 is connected to the other end of the low-impedance precision resistor Rm. The output of the second operational amplifier Op2 is firstly connected via a resistor R6 to the common connection point of the triac T1, T2 and the low-impedance precision resistor Rm and secondly it is connected via a resistor R7 to its inverting input (−).

With respect to the two operational amplifiers Op1, Op2 considered previously, it should also be noted that the supply voltage sources required for these operational amplifiers and their connection to the relevant operational amplifiers are not shown here since this has nothing to do with the present invention as such.

As a result of the previously explained type of connection of the two operational amplifiers Op1, Op2 with their non-inverting inputs (+) and inverting inputs (−) to the low-impedance precision resistor Rm, it is found that the first operational amplifier Op1 operates as a non-inverting amplifier and evaluates the positive half-waves of the respectively decreasing voltage at the low-impedance precision resistor Rm. In contrast, the second operational amplifier Op2 operates as an inverting amplifier which evaluates the negative half-waves of the respectively decreasing voltage at the low-impedance precision resistor Rm.

The output signals respectively delivered in this manner from the outputs of the two operational amplifiers Op1, Op2 are supplied in the case of the first operational amplifier Op1 to the input I1 of an evaluating circuit Ec and in the case of the second operational amplifier Op2 to the input I2 of the relevant evaluating circuit Ec. This evaluating circuit compares the relevant output signals with specified threshold voltages and depending on the magnitude by which the output signals respectively delivered by said operational amplifiers Op1, Op2 exceed or fall below specified threshold voltages, delivers status signals to outputs O1 or O2 which either indicate a correct current flow or a perturbed current flow through the respective load circuit, comprising in the present case on the one hand the electric consumer R1 and the triac T1 in series therewith and on the other hand, the electric consumer R2 and the triac T2 in series therewith with its main load section.

In the operating mode of the load circuits shown in the drawing which has been considered previously, it has been assumed that these are all operating simultaneously. In this case, a status signal indicating a perturbed current flow which appears at one of the outputs O1, O2, for example, with a high level indicates that there is a fault in at least one of the relevant load circuits. In this case, the aforementioned threshold voltages are stipulated according to the overall operation of all the load circuits. A status signal which appears with a low level for example would then indicate correct operation of the detected load circuits.

In principle, however, it is also possible for all the existing load circuits to be divided into groups each comprising a plurality of load circuits and for the load circuits belonging to respectively one such load circuit group to be operated at the same time. In this case, threshold voltages corresponding to the normal current values of the respective load circuit group would then need to be provided in the evaluation circuit Ec. That is, a corresponding synchronisation must be produced between the delivery of control signals by the control device Ctr and the provision of the respectively relevant threshold voltages in the evaluation circuit Ec. This synchronisation can be achieved, for example, by a synchronous switch-over in the control signal delivery and the provision of the threshold voltage.

In order to ascertain which individual load circuit is operating incorrectly, the aforesaid synchronisation between the delivery of the control signals by the control device Ctr and the provision of the respectively relevant threshold voltage in the evaluation circuit Ec should be extended to each individual load circuit. For this purpose, firstly the controlled semiconductor switches of the existing load circuits are individually activated one after the other and secondly, individually relevant threshold voltages are provided for the load circuits concerned in the evaluation circuit Ec. The status signals thereby determined are then individually assigned to the relevant load circuits whereby the fault can rapidly be isolated.

As a result of the afore-mentioned status signals, in the event that an electric consumer is formed by a circulating pump without separate speed feedback, a too-high current flow relative to a predetermined rated value can be identified and it can be deduced therefrom that the relevant circulating pump is blocked whereupon the circuit of the relevant circulating pump can be immediately shut down. This means that the controlled semiconductor switches in the load circuit of this electric consumer can have a lower power and smaller cooling area than in the case where such a shutdown cannot take place immediately because of a lack of corresponding monitoring.

In addition, the monitoring of the mode of operation of the respectively provided load circuits undertaken by the evaluation arrangement Ed described can be represented by a plain-text display or by a seven-segment display by means of corresponding display devices which can result in simplified and more rapid fault finding when the mode of operation of the relevant load circuits is disturbed. In this connection, it can also be displayed that no fault is detected or that the load circuits are operating correctly. These types of displays could also be made available to customer service by remote interrogation to be able to make diagnoses beforehand. In this case, the present invention makes fault finding simpler and more rapid in the event of faulty operation of one or more load circuits.

In addition, a permanent mode (full-wave mode) and a half-wave mode in the respective load circuit can be easily identified by the present invention. The identification of a continuous half-wave mode especially when using pump motors as electric consumers is especially important since these pump motors are destroyed during continuous half-wave operation. Remedial measures are provided here by full-wave control of the relevant motors associated with the output of a corresponding warning and shutdown of the relevant pump motors which is initially possible. This can be ensured by the present invention.

Finally, it should be noted that the present invention has been explained previously in connection with monitoring of the operating mode of two load circuits. However, the invention is not restricted thereto; rather, it can be used for monitoring the mode of operation of at least one load circuit but also for monitoring the mode of operation of more than two load circuits.

I claim:

1. A method of monitoring a mode of operation of at least one load circuit being an electric consumer and connected to a controlled semiconductor switch and at least one alternate voltage source, which comprises the steps of:
    supplying an alternating voltage containing positive and negative voltage half-waves to a circuit formed by the electric consumer and the controlled semiconductor switch;
    guiding alternating currents flowing through the controlled semiconductor switch and the electric consumer through a common low-impedance precision resistor; and
    evaluating a respective alternating voltage drop occurring at the common low-impedance precision resistor separately with respect to amplitudes of the positive and negative alternating voltage half-waves.

2. The method according to claim 1, wherein:
    the electric consumer is a domestic appliance; and
    the controlled semiconductor switch is a triac.

3. The method according to claim 1, wherein:
    the electric consumer is one of two electric consumers; and
    the controlled semiconductor switch is one of two controlled semiconductor switches each respectively connected to one of the electric consumers and both of the controlled semiconductor switches connected to the common low-impedance precision resistor.

4. A circuit configuration for monitoring a mode of operation of at least one load circuit supplied by at least one alternating voltage source supplying an alternating voltage having positive and negative voltage half-waves, the circuit configuration comprising:
    a controlled semiconductor switch connected to the load circuit functioning as an electric consumer;
    a low-impedance precision resistor connected between said controlled semiconductor switch and the at least one alternating voltage source; and
    an evaluation unit for separately evaluating the positive and negative voltage half-waves of the alternating voltage and connected to said low-impedance precision resistor.

5. The circuit configuration according to claim 4, wherein said evaluation unit contains a first evaluating device for evaluating the positive voltage half-waves of the alternating voltage and a second evaluating device for evaluating the negative voltage half-waves of the alternating voltage.

6. The circuit configuration according to claim 5, wherein:
    said low-impedance precision resistor has first and second ends;
    said first evaluating device contains a first operational amplifier having an inverting input and a non-inverting input coupled to said first and second ends of said low-impedance precision resistor; and
    said second evaluating device contains a second operational amplifier having an inverting input and a non-inverting input connected to said first and second ends of said low-impedance precision resistor.

7. The circuit configuration according to claim 6, wherein:
    said non-inverting input of said first operational amplifier and said inverting input of said second operational amplifier are coupled to said first end of said low-impedance precision resistor; and
    said inverting input of said first operational amplifier and said non-inverting input of said second operational amplifier are coupled to said second end of said low-impedance precision resistor.

8. The circuit configuration according to claim 6, wherein:
    said first and second operational amplifiers have outputs; and
    said evaluation unit has an evaluating circuit connected to said outputs of said first and second operational amplifiers, said evaluating circuit comparing output signals respectively output by said first and second operational amplifiers with specified threshold voltages and, depending on magnitudes of output voltages of the output signals delivered by said first and second operational amplifiers exceeding or falling below the specified threshold voltages, said evaluating circuit outputting status signals indicating either a correct current flow or a perturbed current flow through the electric consumer and said controlled semiconductor switch.

9. The method according to claim 4, wherein:
    the electric consumer is a domestic appliance; and
    said controlled semiconductor switch is a triac.

10. The method according to claim 4, wherein:
the electric consumer is one of two electric consumers; and
said controlled semiconductor switch is one of two controlled semiconductor switches each respectively connected to one of the electric consumers and both of said controlled semiconductor switches are connected to said low-impedance precision resistor.

* * * * *